United States Patent [19]
Gill et al.

[11] Patent Number: 5,200,350
[45] Date of Patent: Apr. 6, 1993

[54] FLOATING-GATE MEMORY ARRAY WITH SILICIDED BURIED BITLINES

[75] Inventors: Manzur Gill, Rosharon; Howard L. Tigelaar, Allan, both of Tex.

[73] Assignee: Texas Instruments Incorporated, Dallas, Tex.

[21] Appl. No.: 736,337

[22] Filed: Jul. 26, 1991

Related U.S. Application Data

[60] Division of Ser. No. 576,086, Aug. 30, 1990, Pat. No. 5,095,345, which is a continuation of Ser. No. 269,849, Nov. 10, 1988, abandoned.

[51] Int. Cl.[5] .................... H01L 21/265; H01L 21/70
[52] U.S. Cl. ........................................ 437/43; 437/48; 437/195
[58] Field of Search .................... 437/48, 52; 357/23.6

[56] References Cited

U.S. PATENT DOCUMENTS

| | | | |
|---|---|---|---|
| 4,373,248 | 2/1983 | McElroy | 437/52 |
| 4,426,764 | 1/1984 | Kosa et al. | 437/52 |
| 4,849,369 | 7/1989 | Jeuch et al. | 437/48 |
| 4,851,365 | 7/1989 | Jeuch | 437/48 |
| 5,023,680 | 6/1991 | Gill et al. | 357/23.5 |

OTHER PUBLICATIONS

Sze "VLST Technology" McGraw-Hill Book Company, second edition, New York, 1988, p. 267 and p. 495.

Primary Examiner—Olik Chaudhuri
Assistant Examiner—Loc Q. Trinh
Attorney, Agent, or Firm—Theodore D. Lingren; Leo N. Heiting; Richard L. Donaldson

[57] ABSTRACT

A contact-free floating-gate non-volatile memory cell array and process with silicided NSAG bitlines and with source/drain regions buried beneath relatively thick silicon oxide. The bitlines have a relatively small resistance, eliminating the need for parallel metallic conductors with numerous bitline contacts. The array has relatively small bitline capacitance and may be constructed having relatively small dimensions. Isolation between wordlines and between bitlines is by thick field oxide regions. A thick field oxide strip separates each ground conductor/bitline pair. Wordlines may be formed from silicided polycrystalline or other material with low resistivity. Coupling of programming and erasing voltages to the floating gate is improved by extending the gates over the thick field oxide and perhaps by using an insulator with relatively high dielectric constant between the control gate and the floating gate. The resulting structure is a dense cross-point array of programmable memory cells.

20 Claims, 4 Drawing Sheets

FLOATING-GATE MEMORY ARRAY WITH SILICIDED BURIED BITLINES

RELATED PATENT APPLICATIONS

This is a division of application Ser. No. 07/576,086, filed Aug. 30, 1990 now U.S. Pat. No. 5,095,345 which is a continuation of application Ser. No. 07/269,849 filed Nov. 10, 1988 now abandoned.

This application discloses subject matter also disclosed in U.S. Pat. No. 5,051,796, U.S. Pat. No. 5,025,494, U.S. Pat. No. 5,023,680, and co-pending application Ser. No. 07/270,546, all of which are hereby incorporated herein and filed herewith and all of which are also assigned to Texas Instruments Incorporated.

BACKGROUND OF THE INVENTION

This invention relates to integrated-circuit erasable-programmable-read-only-memory (EPROM) arrays and to electrically-erasable-programmable-read-only-memory (EEPROM) arrays and, in particular, to EPROM and EEPROM structures having buried bitlines that include source-drain regions.

Floating-gate, avalanche-injection, metal-oxide-semiconductor (FAMOS) structures having buried, diffused bitlines that include source-drain regions are described in U.S. Pat. No. 4,373,248 issued Feb. 15, 1983 to David J. McElroy and in U.S. patent application Ser. No. 128,549 filed Dec. 3, 1987, now abandoned both assigned to Texas Instruments Incorporated. Such structures have several advantages over other structures, including smaller memory-cell area, reduced number of contacts, and planar array topography. On the other hand, the described structures have disadvantages, including an interdependent relationship between N+ junction depth and the thickness of the isolation oxide over the buried bitlines, high bitline junction capacitance, high drain-to-floating-gate capacitance and non-silicided bitlines. In addition, the described structures cannot be linearly shrunk without decreasing the coupling ratio of the control-gate voltage to the floating-gate voltage during programming and/or erasing.

The capacitance of prior-art buried N+ bitlines is high because of the required deeply buried N+ junction that assures adequate grown oxide thickness above the buried N+, because of the required relatively wide bitlines that ensure adequate coupling between polycrystalline silicon (polysilicon) layers, and because of the junction capacitance in the bitline isolation region. See, for example, J. Esquivel, et al.; IEDM Tech. Digest Papers, 592 (1986).

Prior-art buried N+ FAMOS devices have high drain-to-floating-gate capacitive coupling, leading to a small margin between the device drain-coupled turn-on voltage and the device breakdown voltage during programming. As a result, a part of the programming current may flow through non-selected bits sharing a bitline with the selected bit, causing reduced threshold voltage shift in the programmed bits.

The buried bitlines of prior-art devices generally cannot be silicided because the buried N+ junctions and the oxide insulating regions over those junctions are formed early in the process, before formation of the gate oxide, the floating gate, the control or programming gate and other field-effect devices. Some of the later-occurring steps in the process for forming those elements require temperatures higher than 900° Celsius, and processes at temperatures that high are not desirable after siliciding of the buried N+ bitlines. Without siliciding, the bitlines have a high resistance that requires space-consuming connections with parallel metal conductors at intervals of every few transistor cells. A prior-art silicided buried bitline process and structure is described in U.S. Pat. No. 4,597,060 issued Jun. 24, 1986 to Allan T. Mitchell et al. and assigned to Texas Instruments Incorporated. The process and structure of that invention requires formation of the silicided bitlines prior to formation of the inter-level dielectric layer and the combined control gates/wordlines.

Accordingly, there is a need for an integrated-circuit structure and a procedure for fabricating that structure such that bitline and drain-to-floating-gate capacitances are decreased, such that the N+ junction depth/profile can be optimized independent of oxide thickness above the bitlines, and such that the coupling ratio of the control-gate voltage to the floating-gate voltage does not decrease as the memory cell dimensions are downsized. In addition, there is a need for bitlines that are silicided to allow elimination of presently used metal interconnect conductors above and parallel to buried bitlines. In further addition, there is a need to maximize the cell drain current during read operation.

SUMMARY OF THE INVENTION

The buried-bitline structure of this invention decreases bitline and drain-to-floating-gate capacitances and permits downsizing of memory-cell dimensions without adversely affecting the coupling ratio of the control-gate voltage to the floating-gate voltage during programming or erasing. The bitline capacitance is reduced through use of NSAG (N+ Self-Aligned Gate) bitlines that are buried under wordlines. Reduced total lateral diffusion of the NSAG bitlines decreases the capacitance between the drain and the floating-gate. The process permits the bitlines to be silicided to lower the bitline resistance and therefore to decrease the number of contacts necessary, eliminating the need for parallel interconnect conductors. The N+ junction depth/profile is independent of the thickness of the oxide above the buried bitlines. Bitline isolation is by thick oxide, rather than by P/N junction or by trench isolation as in U.S. Pat. No. 5,051,796 (interim designation TI-12514), also assigned to Texas Instruments Incorporated.

The memory cell array has common conductors between each pair of bitlines and the pairs of bitlines are separated by a continuous strip of thick field oxide, rather than the alternate conductor/bitline configuration of U.S. Pat. No. 5,025,494 and co-pending U.S. patent application Ser. No. 07/270,596 (interim designations TI-12513 and TI-13788), also assigned to Texas Instruments Incorporated. Presence of the thick field oxide strip between bitlines provides electrical isolation between the bitlines. In addition, coupling ratio of the control-gate-to-floating-gate capacitance and the floating-gate-to-substrate capacitance is a function of overlap of the control and floating gates on the thick field oxide as well as of the dielectric properties and thickness of the insulating layers between those elements. Increased cell drain current is obtained by enlarging the cell width.

The array implementation used is of the "virtual-ground" type. During programming, the middle of the three diffused conductors acts as the virtual ground conductor; however, that conductor is not decoded.

The potential of the virtual-ground conductor is perhaps in the 0-1 volt range to improve the margin between device breakdown voltage and device programming voltage. During read operation, the middle diffusion connected to the "read-drain" of the selected transistor goes high (perhaps 2 volts) and the bitline connected to the "read-source" of the selected transistor goes low while the other bitlines are allowed to float in EPROM applications and all of the bitlines are read in EPAL applications. The structure of the programming drain is optimized for programming operation, whereas the structure of the read drain is optimized for read operation.

The structure and process described herein require less stringent mask alignments than those required for the structure and process described in U.S. Pat. No. 5,023,650 (interim designation TI-13787) filed herewith.

BRIEF DESCRIPTION OF THE DRAWINGS

The novel features of this invention are set forth in the appended claims. The invention, its features, and its advantages are described below in conjunction with the following drawings:

DETAILED DESCRIPTION OF THE SPECIFIC EMBODIMENT

Figure 1:
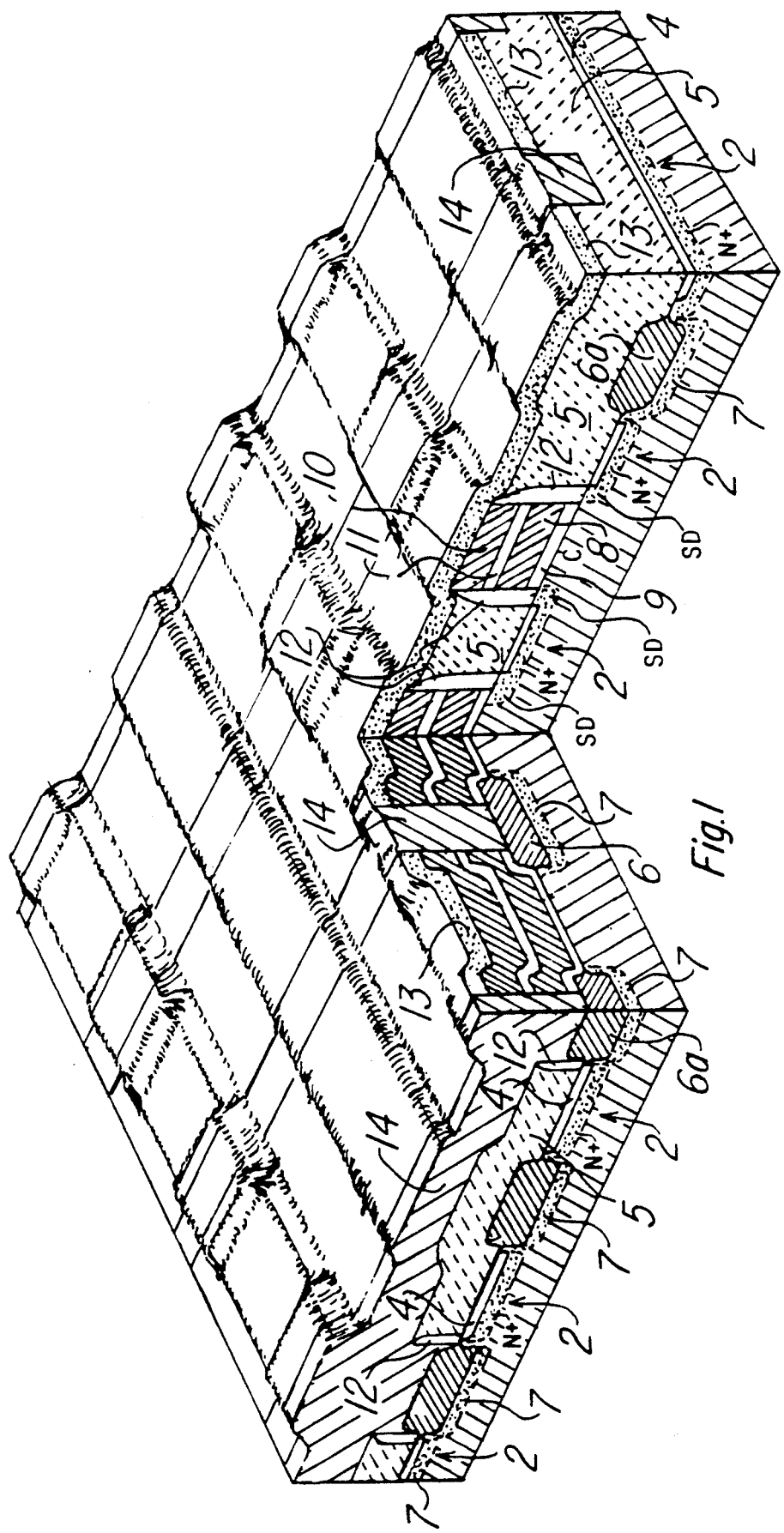
FIG. 1 represents an isometric view, in section, of a part of the cross-point FAMOS array of this invention. The two center sections represent elevation views drawn through the gates of the transistors of the embodiments. The two outside sections represent elevation views drawn through regions between those gates.

Referring to FIG. 1, for example, FAMOS transistors 1 include a plurality of buried conductors 2 in the face of semiconductor substrate 3. Buried conductors 2 are formed using a NSAG process and include silicided upper-surface regions 4. The conductors 2 are heavily doped regions buried under a relatively thick first insulating oxide strips 5, and are continuous through the array of FAMOS transistors. Buried conductors 2 are isolated from each other in part by thick field oxide regions 6 and thick field oxide strips 6a, which are illustrated in FIG. 1 as grown field oxide regions and strips 6 and 6a over P-type channel-stop regions 7. Conductors 2 are separated in longitudinal groups of three by thick field oxide strips 6a. The outside conductors 2 of each group are bitlines and the center conductor is a ground conductor during programming operation. Conductors 2 include N+ doped source-drain regions SD adjacent each channel region C. Each polysilicon floating gate 8 is separated from a channel region C by gate oxide layer 9 and from a control gate section 10 by an inter-level dielectric layer 11. Floating gate 8, inter-level dielectric layer 11 and control gate section 10 extend over field oxide regions 6 on the non-source-drain sides of the cell to increase the coupling ratio between the gates 10 and 8. For use in EEPROM applications and as illustrated in FIGS. 3b-3d, gate oxide layer 9 may have a thin tunnelling region 9a for erasing. Tunnelling region 9a may have a thickness of perhaps 100 Angstroms, as compared to 350-400 Angstroms for the remainder of gate oxide layer 9. Silicided bitlines 2 include N+ doped source-drain regions SD. Sidewall oxide spacers 12 may be used to separate silicided regions 4 from floating gate 8 and are located adjacent the sides of each floating gate 8 and of each control gate 10 above each source-drain region SD. Wordlines 13, which may be silicided polysilicon or refractory metal, connect control gates 10. Wordlines 13 are substantially at right angles with respect to conductors 2. Second insulating oxide strips 14 are located between parallel wordlines 13, separating gates 8 and 10, and are above field oxide regions 6 and first insulating oxide strips 5.

The extensions of floating gate 8, inter-level dielectric layer 11 and control gate 10 over the upper surface of field oxide region 6 improve the coupling of programming and erasing voltages to floating gate 8. The material for and dimensions of inter-level dielectric layer 11 and gate oxide layer 9 may be chosen to improve further the coupling to the floating gate of programming and erasing signals applied at control gate 10. As is well-known, the capacitance between control gate 10 and floating gate 8 should ideally be much greater than the capacitance between floating gate 8 and other nodes for appropriate coupling of the programming voltage to produce either tunnelling of electrons between the substrate 3 and floating gate 8 in EEPROM applications or avalanche injection to the floating gate 8 in EPROM applications. And as in all floating-gate, non-volatile memory devices, those capacitances vary according to relative sizes of gate surfaces and channel surfaces, according to dielectric types, and according to dielectric thicknesses.

It is desirable for memory-cell arrays to have a very low bitline capacitance because a small bitline capacitance improves speed of operation. In prior-art buried conductor cells the bitline capacitance is determined by the depth and area of the depletion region formed by the reverse-biased diode junction of what would correspond to the N+ conductor 2 and the P-doped substrate 3 of this invention. The bitline capacitance of the device of this invention is less than that of prior-art structures because the area of N+/P junction is reduced by narrowing bitline 2 and by reducing the N+/P junction depth.

As illustrated in the embodiment of FIG. 1, the overlap of floating gate 8 on field oxide 6 increases the capacitance between control gate 10 and floating gate 8, thereby increasing the coupling of programming voltages to floating gate 8. In addition, judicious choices of thickness and of dielectric constants for gate oxide layer 9 and inter-level dielectric layer 11 may be made to increase that coupling. In general, the thickness of inter-level dielectric layer 11 should be less than that of gate oxide layer 9 and the dielectric constant of inter-level dielectric layer 11 should be greater than that of gate oxide layer 9 for improved coupling.

Figure 2:
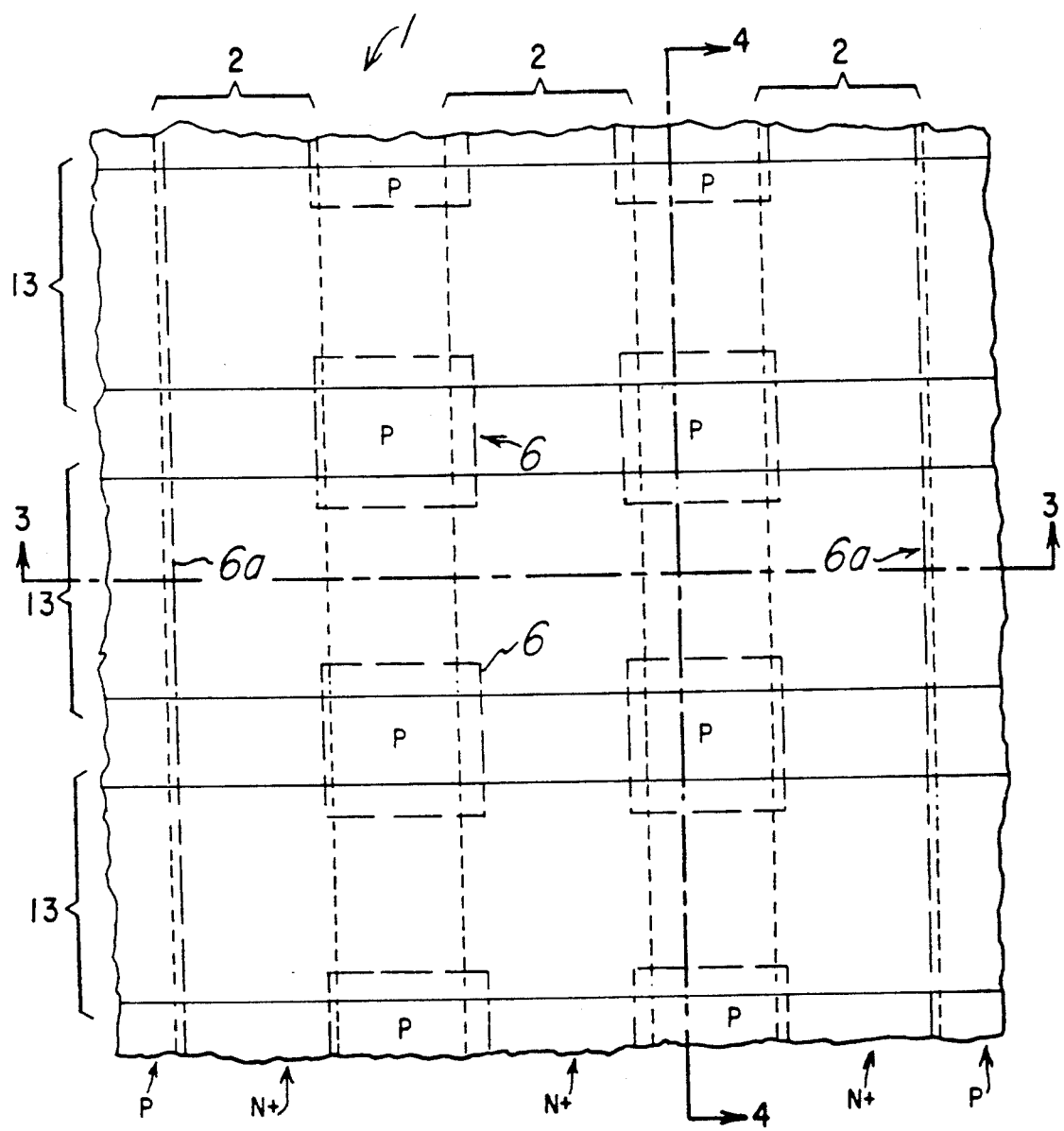
FIG. 2 represents a top view of the device of this invention.

A method of making the device of FIG. 1 will be described in reference to FIGS. 3a-3d and 4a-4d. The starting material is a slice of P-type silicon, of which the semiconductor substrate 3 is a very small portion. The slice is perhaps six inches in diameter, while the portion shown in FIG. 1 is only a few microns wide. A number of process steps would be performed to create transistors peripheral to the array, and these steps are not discussed herein. For example, the memory device would typically be of the field-effect type having N-wells and P-wells formed in the substrate. Those N- wells and P-wells may require a voltage-threshold adjustment process, as is well-known. The first step related to the cell array of the invention is the forming of thick field oxide regions 6, thick field oxide strips 6a and channel stop regions 7 using a well-known LOCOS or high pressure oxidation process. Referring now to FIGS. 2 and 4a, regions and strips 6, 6a and 7 are formed in the parts of the surface of substrate 3 marked P in FIG. 2 where field oxide regions and strips 6 and 6a are to be grown. As part of a LOCOS or high pressure oxidation procedure, areas of substrate 3 not covered by oxide/nitride layer 15 may be subjected to a boron impurity implant 16, as illustrated in FIG. 4a. The substrate is then subjected to an oxidizing atmosphere, in accordance with well-known procedures, to form regions and strips 6, 6a and 7 as illustrated in FIG. 4b.

Figure 3A:
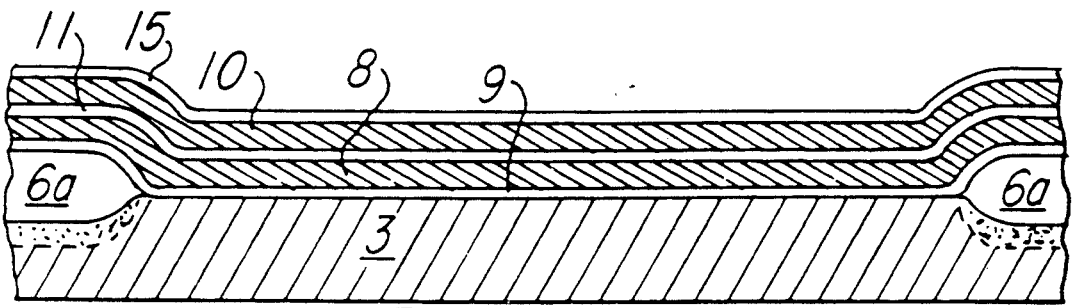
FIGS. 3a-3d represent, in section as indicated, elevation views of the device of FIG. 2 and of the right inner section of FIG. 1 at various stages of fabrication.
Figure 3B:
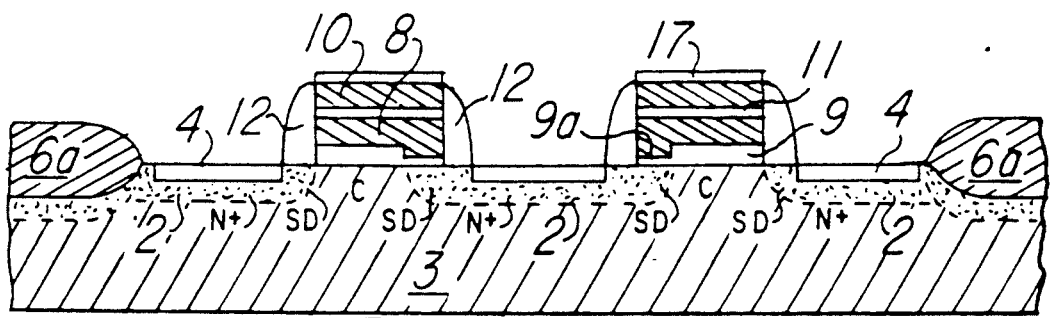
Figure 3C:
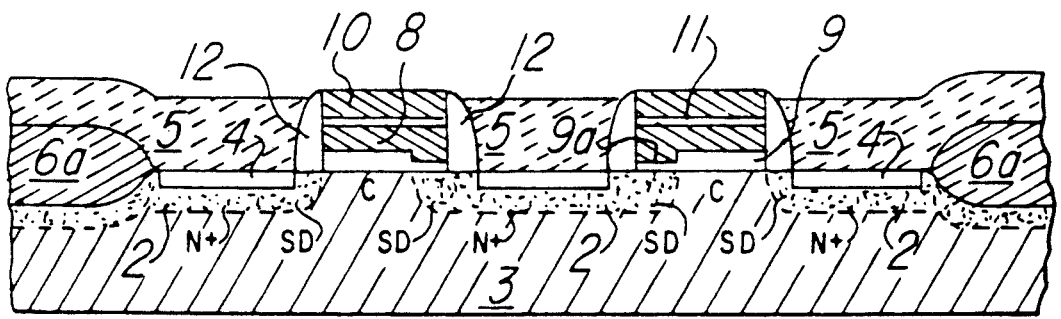
Figure 3D:
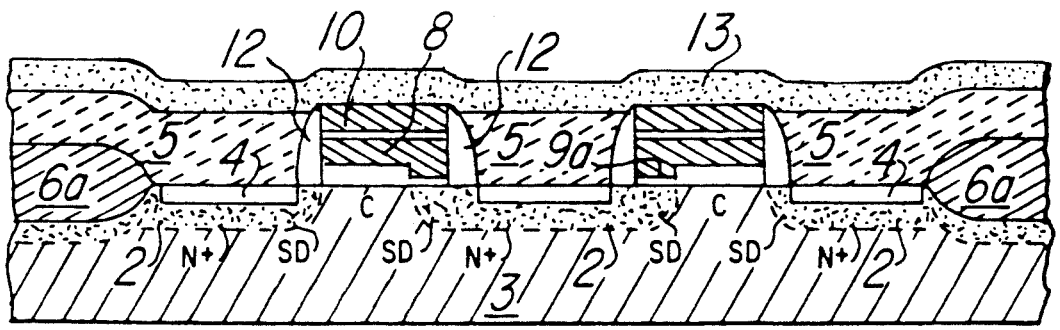
Figure 4A:
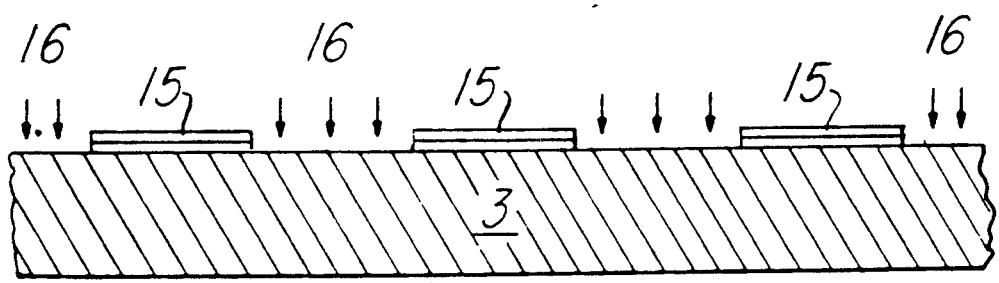
FIGS. 4a-4d represent, in section as indicated, elevation views of the device of FIG. 2 and of the left inner section of FIG. 1 at various stages of fabrication.
Figure 4B:
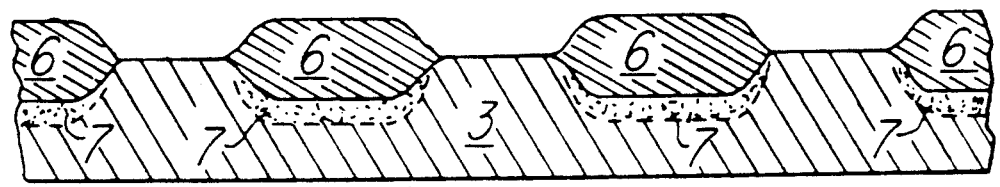
Figure 4C:
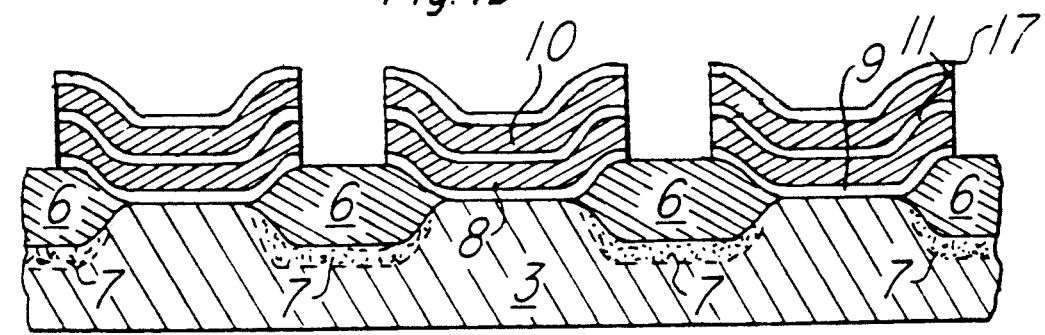

As indicated in FIG. 3a, the next step related to the cell array of the invention is forming a gate oxide layer 9 approximately 350 Angstroms thick by exposing the face of substrate 3 to oxygen and gaseous hydrochloric acid at ambient pressure and at a temperature of approximately 950° Celsius for about 50 minutes, using conventional gate oxidation procedure. Tunnelling region 9a may be formed by patterning and etching gate oxide layer 9, re-growing oxide if necessary.

Next, first conductive or polysilicon floating gate 8 layer is applied to the surface, as also indicated in FIG. 3a. The first conductive or floating gate 8 layer may be about 3000 Angstroms thick and is doped N+.

Referring again to FIG. 3a, inter-level dielectric layer 11 is then formed of silicon oxide, or of oxide-nitride-oxide, or of aluminum oxide, or of aluminum nitride, or of tantalum pentaoxide, for example, according to well-known procedures. The dielectric constant of inter-level dielectric layer 11 should be as large as possible and its thickness should be small as possible, consistent with EPROM and EEPROM requirements for wordline-to-floating gate capacitive coupling ratio, for dielectric breakdown voltage, and for dielectric charge leakage criteria.

Next, second conductive or polysilicon control gate 10 layer is applied to the surface using conventional procedures, as also indicated in FIG. 3a. Second conductive or control gate 10 layer may also be approximately 3000 Angstroms thick and is doped N+.

A protective layer 17 of oxide, or of oxide-nitride, is then deposited over the surface using well-known methods, as illustrated in FIG. 3a.

Referring now to FIG. 3b, strips that will become control gates 10 and floating gates 8 are formed by patterning the surface of protective layer 17 and stack-etching through protective layer 17, control gate 10 layer, inter-level dielectric layer 11 and floating gate 8 layer. An oxide may then be grown on the sides of the strips that will become control gates 10 and floating gates 8 for the purpose of improving data retention in floating gates 8.

As illustrated in FIG. 3b, conductors 2 are then formed by implanting with arsenic to create an abrupt junction on the programming side and by double implantation of both arsenic and phosphorus to create a graded junction on the read side, indicated as N+ source-drain regions SD in the surface of substrate 3. The implantation is followed by a standard implant anneal at appropriate temperature. The arsenic/phosphorus implant provides a graded junction that avoids read disturb caused by hot electron effect and that suppresses write disturb during programming.

As also illustrated in FIG. 3b, sidewall oxide regions 12 may then be formed on the sides of the strips that will become control gates 10 and floating gates 8 using well-known procedures, such as those described in U.S. Pat. No. 4,566,175, issued Jan. 28, 1986 and assigned to Texas Instruments Incorporated.

Alternatively, a lightly doped (commonly referred to as LDD) junction profile may be formed on the read side to avoid read/write disturb by performing the arsenic/phosphorus implant and annealing step after sidewall oxide regions 12 are formed, as also described in U.S. Pat. No. 4,566,175 referenced above. Whether the junction is lightly doped or doubly diffused, it should completely underlay tunnelling region 9a to avoid read disturb.

The conductors 2 are then silicided in accordance with well-known procedures to form silicide regions 4. One such procedure is described in U.S. Pat. No. 4,672,419, issued Jun. 9, 1987 and assigned to Texas Instruments Incorporated. It is desirable to select subsequent processes that do not require temperatures exceeding 900° Celsius to prevent dopant diffusion from the junction to the silicided region, and to avoid junction spiking.

Referring now to FIG. 3c, the structure is then made planar by using a procedure that requires a temperature of 900° Celsius or less. One such procedure is the deposition of a thick oxide over the structure and the use of a resist etch-back process to remove the higher elevations of that oxide. The etch removes protective layer 17 from the upper surfaces of strips that will become control gates 10 and floating gates 8. As a result of this step, bitlines 2 are buried under first insulating oxide strips 5.

Figure 4D:
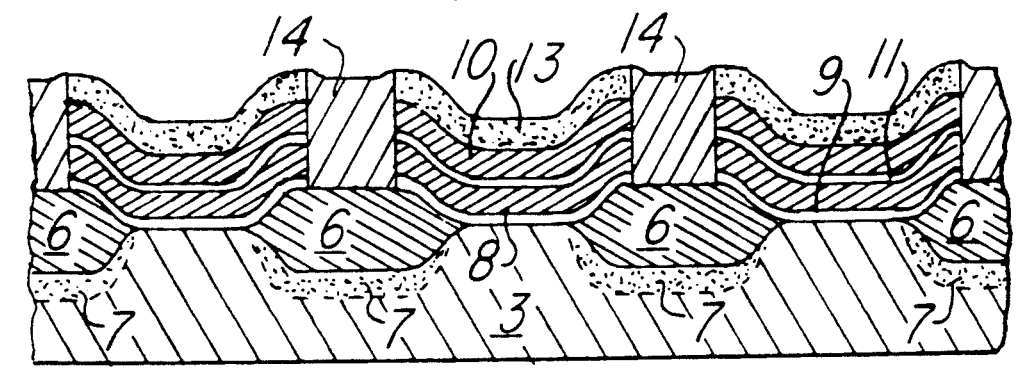

Referring now to FIGS. 3d and 4d, a third conductive or wordline 13 polysilicon layer is formed on the surface of the structure and is doped N+. Third conductive or polysilicon wordline 13 layer may be silicided for increased conductivity. Wordline 13 layer may also be formed from layered refractory metal and polysilicon. In the alternative, wordline 13 layer may be formed from a refractory metal such as tungsten, or from a refractory metal silicide such as tungsten silicide or titanium silicide. Wordlines 13 are patterned and stack etching is conducted through wordline 13 layer, control gate 10 strips, inter-level dielectric layers 11 and floating gate 8 strips to form wordlines 13, control gates 10 and floating gates 8, as illustrated in FIGS. 1, 3d and 4d. The generally practiced plasma etch technique chosen for this step should etch polysilicon faster than oxide in order that a relatively small part of first oxide insulating strips 5 and sidewall oxide regions 12 will be removed. Again, an oxide coating may be formed, perhaps by thermal oxidation, on the sides of control gates 10 and floating gates 8 to improve data retention in floating gates 8. Also as illustrated in FIG. 4d, the structure may again be made planar by depositing an oxide and using a resist etch-back procedure similar to that used previously to form second insulating oxide strips 14.

The upper surface may then be covered with a final layer of oxide, again made planar, and etched at appropriate locations to provide contact with metal conductors, which are formed by depositing a metal layer, then patterning and etching that metal layer.

Second insulating oxide strips 14 may be discontinuous at points where those strips 14 pass over thick field oxide regions and strips 6 and 6a, depending on the relative heights of the elements and on the processes used.

During programming operation of the memory array of FIG. 1, a high voltage is applied to the conductor 2 adjacent the thick field oxide region 6a, or bitline 2, of a cell to be programmed. At the same time, a low voltage, perhaps 0–1 volt, is applied to the virtual-ground common conductor 2 connected to the opposite source-drain SD of the cell and the same low voltage is applied to the bitline 2 of the adjacent deselected cell, and 0 volt to all other conductors. Alternatively, bitline 2 of the adjacent deselected may be allowed to float. During programming, hot electrons are injected into the floating gate 8 from the source-drain SD adjacent the thick field oxide region 6a, which is tailored for optimum injection efficiency of hot electrons. Tailoring may, for example, be such that the N+/P junction is made abrupt.

During reading operation of a cell in the memory array of this invention, a voltage of perhaps 2 volts is applied to the middle conductor 2, the read-drain of the cell to be read. At the same time, the read-source of the cell (one of the two side conductors) is connected to ground. The bitline 2 of the adjacent deselected cell is left open for EPROM/EEPROM applications, but not for EPLD/EEPLD applications. The source-drain SD (read-drain center conductor) opposite the thick field oxide region 6a is doubly diffused or is of the lightly doped (LDD) type to avoid read disturb. In electrically erasable applications, the doubly diffused or lightly doped source-drain SD junction overlapping 100 Angstrom tunnel oxide region 9a will avoid read disturb.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A method for making a non-volatile memory cell array including bitlines and wordlines in a face of a semiconductor substrate of first conductivity type, comprising the steps of:
   forming thick field oxide regions and thick field oxide strips, both with underlying channel stop regions in said face;
   growing a gate oxide layer of said face;
   applying a first conductive layer of said face;
   applying a second conductive layer of said face overlying and insulated from said first conductive layer by an inter-level dielectric layer;
   forming a protective layer over said second conductive layer;
   patterning said protective layer and etching said protective layer, said second conductive layer, said inter-level dielectric layer, said first conductive layer, and said gate oxide layer to form control- and floating-gate strips such that said strips are substantially centered on said field oxide regions and such that said strips extend over said field oxide regions and said field oxide strips;
   implanting an impurity material of second conductivity type to form conductors parallel to and adjacent to said control- and floating-gate strips, with three of said conductors between said thick field oxide strips;
   siliciding said conductors;
   forming a first insulating oxide in the space between said control- and floating-gate strips and over said conductors;
   removing a part of said first insulating oxide and substantially all of said protective layer to form a surface substantially planar including the upper surface of said second conductive layer;
   applying a third conductive layer to said substantially planar surface; and
   patterning said third conductive layer and etching through said third conductive layer and said control- and floating-gate strips to form wordlines from said third conductive layer, control gates from said control-gate strips and floating gates from floating-gate strips while leaving said conductors protected by said first insulating oxide, wherein said wordlines, control gates and floating gates are substantially centered between said thick field oxide regions and extend over a part of adjacent said thick field oxide regions.

2. A method according to claim 1 including forming second insulating oxide strips on said face between said wordlines and over portions of said first insulating oxide strips and over said thick field oxide regions.

3. A method according to claim 1 wherein said first impurity-type is P-type and said second impurity-type is N-type.

4. A method according to claim 1 wherein said first and second layers are polycrystalline silicon.

5. A method according to claim 1 wherein sidewall oxide spacers are formed adjacent said control-gate strips and said floating-gate strips after said implanting of an impurity material of second conductivity type.

6. A method according to claim 1 wherein sidewall oxide spacers are formed adjacent said control-gate strips and said floating-gate strips before said implanting of an impurity material of second conductivity type.

7. A method according to claim 1 wherein the capacitance associated with said gate oxide layer is less than the capacitance associated with said inter-level dielectric layer.

8. A method according to claim 1 wherein said inter-level dielectric layer includes silicon oxide.

9. A method according to claim 1 wherein said inter-level dielectric layer includes oxide-nitride-oxide.

10. A method according to claim 1 wherein said inter-level dielectric layer includes aluminum oxide.

11. A method according to claim 1 wherein said inter-level dielectric layer includes aluminum nitride.

12. A method according to claim 1 wherein said inter-level dielectric layer includes tantalum pentaoxide.

13. A method according to claim 1 wherein two impurities are implanted to form graded junctions in at least the middle conductor of said three conductors.

14. A method according to claim 1 wherein two impurities are implanted to form graded junctions in at least the middle conductor of said three conductors, wherein said implantation is made after formation of sidewall oxide spacers adjacent said control-gate strips and said floating-gate strips.

15. A method according to claim 1 wherein said third conductive layer is polycrystalline silicon.

16. A method according to claim 1 wherein said third conductive layer is silicided polycrystalline silicon.

17. A method according to claim 1 wherein said third conductive layer is refractory metal.

18. A method according to claim 1 wherein said third conductive layer is layered refractory metal and polysilicon.

19. A method according to claim 1 wherein said underlying channel stop region is formed using boron doping.

20. A method according to claim 1 including at least one step for growing oxide on the sides of said floating gates for the purpose of improved data retention.

* * * * *